United States Patent
Jungmann et al.

(10) Patent No.: US 12,283,312 B2
(45) Date of Patent: Apr. 22, 2025

(54) SHORT CIRCUIT DETECTION IN A READ/WRITE ASSIST CAPACITOR OF A MEMORY

(71) Applicant: International Business Machines Corporation, Armonk, NY (US)

(72) Inventors: Noam Jungmann, Holon (IL); Elazar Kachir, Tel Aviv (IL); Bishan He, Poughkeepsie, NY (US); Rajiv Joshi, Yorktown Heights, NY (US); Dureseti Chidambarrao, Weston, CT (US); Baozhen Li, South Burlington, VT (US); Atsushi Ogino, Fishkill, NY (US); Klimentiy Shimanovich, Ramat Gan (IL)

(73) Assignee: International Business Machines Corporation, Armonk, NY (US)

( * ) Notice: Subject to any disclaimer, the term of this patent is extended or adjusted under 35 U.S.C. 154(b) by 265 days.

(21) Appl. No.: 18/302,117

(22) Filed: Apr. 18, 2023

(65) Prior Publication Data
US 2024/0355382 A1    Oct. 24, 2024

(51) Int. Cl.
*G11C 11/417*    (2006.01)

(52) U.S. Cl.
CPC .................. *G11C 11/417* (2013.01)

(58) Field of Classification Search
CPC .... G11C 11/417; G11C 11/418; G11C 11/419
USPC ......................................... 365/226
See application file for complete search history.

(56) References Cited

U.S. PATENT DOCUMENTS

| | | | |
|---|---|---|---|
| 7,502,275 B2* | 3/2009 | Nii | G11C 11/419 365/189.08 |
| 7,924,633 B2 | 4/2011 | Behrends et al. | |
| 9,135,987 B2 | 9/2015 | Joshi et al. | |
| 9,460,776 B2 | 10/2016 | Dally | |
| 9,959,926 B2* | 5/2018 | Hebig | G11C 11/419 |
| 2015/0255343 A1 | 9/2015 | Angyal | |

(Continued)

FOREIGN PATENT DOCUMENTS

CN    104316813 A    1/2015

OTHER PUBLICATIONS

Chang et al., "A 5-nm 135-Mb SRAM in EUV and High-Mobility Channel FinFET Technology With Metal Coupling anc Charge-Sharing Write-Assist Circuitry Schemes for High-Density and Low-VMIN Applications," IEEE Journal of Solid-State Circuits, Jan. 2021, pp. 179-187, vol. 56, No. 1.

*Primary Examiner* — Alexander Sofocleous
*Assistant Examiner* — Tracy Hampton
(74) *Attorney, Agent, or Firm* — CANTOR COLBURN LLP; Yuanmin Cai

(57) ABSTRACT

An integrated circuit includes a semiconductor substrate and integrated circuitry on the semiconductor substrate. The integrated circuitry includes a static random access memory (SRAM) array including a conductive line and an assist circuit having a boost capacitor coupled to boost a voltage on the conductive line. The boost capacitor includes first and second plates. The integrated circuit further includes a sense circuit having an input coupled to one of the first and second plates of the boost capacitor and an output and a sample circuit coupled to the output of the sense circuit. The sample circuit is configured to detect a short circuit in the boost capacitor based on a state change at the output of the sense circuit.

20 Claims, 5 Drawing Sheets

(56) References Cited

U.S. PATENT DOCUMENTS

2016/0327602 A1 11/2016 Subramanian
2016/0379694 A1 12/2016 Kulkarni et al.
2017/0256469 A1 9/2017 Yach

* cited by examiner

SHORT CIRCUIT DETECTION IN A READ/WRITE ASSIST CAPACITOR OF A MEMORY

BACKGROUND OF THE INVENTION

This disclosure relates to memory and, in particular, to static random access memory (SRAM) employing a metal capacitor to assist read and/or write accesses to memory cells in the SRAM. Still more particularly, the present disclosure relates to the detection of a short circuit in a metal capacitor utilized to assist read and/or write accesses to memory cells in the SRAM.

SRAM is often employed in embedded applications to provide high performance memory within an integrated circuit. For example, SRAM can be utilized to implement critical path storage, such as cache memory or an address translation structure, in a high performance processor. In such embedded applications, it is desirable to implement a relatively low upper supply voltage ($V_{DD}$) for the SRAM in order to reduce power dissipation and heat. However, to maintain high performance for read and write operations, it is also desirable to utilize various assist circuits to temporarily boost one or more line voltages above $V_{DD}$ or below a lower supply voltage $V_{SS}$ (e.g., ground voltage).

In some prior art SRAMs, a boost capacitor is utilized within an assist circuit to boost a line voltage above $V_{DD}$ or below $V_{SS}$. One known technique of implementing such a boost capacitor is by depositing a series of parallel metal lines over the SRAM cells. In such implementations, a first set of the metal lines (or "wires") serve as a first "plate" of the capacitor, a disjoint second set of the metal lines serve as a second "plate" of the capacitor, and the desired capacitance is generated by the capacitive coupling between the first and second sets of metal lines. Although the use of a metal capacitor to provide read/write assist is convenient, efficient floor planning of integrated circuits (ICs) requires increasingly narrow spacing between the metal lines forming the boost capacitor. Due to process variations, a short circuit can be formed during fabrication or can develop between the plates of the capacitor, leading to IC yield loss and/or failure of the IC in the field.

BRIEF SUMMARY

In view of the foregoing, the present application recognizes that it would be useful and desirable to provide a circuit and method for detecting a short circuit in the boost capacitor of an assist circuit of a static random access memory (SRAM) array.

In one or more embodiments, an integrated circuit includes a semiconductor substrate and integrated circuitry on the semiconductor substrate. The integrated circuitry includes a SRAM array including a conductive line and an assist circuit having a boost capacitor coupled to boost a voltage on the conductive line. The boost capacitor includes first and second plates. The integrated circuit further includes a sense circuit having an input coupled to one of the first and second plates of the boost capacitor and an output and a sample circuit coupled to the output of the sense circuit. The sample circuit is configured to detect a short circuit in the boost capacitor based on a state change at the output of the sense circuit.

DETAILED DESCRIPTION

Figure 1:
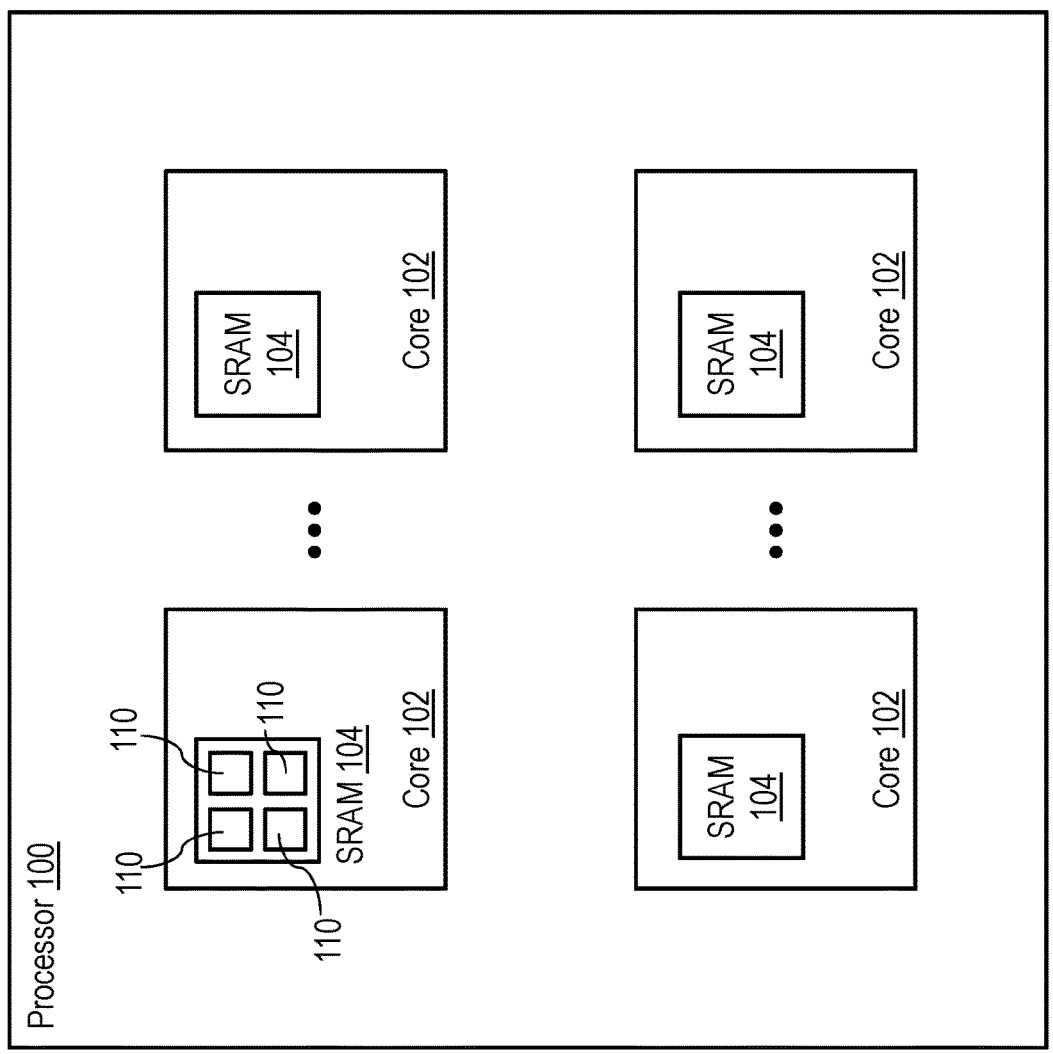
FIG. 1 is a high-level block diagram of an exemplary integrated circuit in accordance with one embodiment.

With reference to the figures and with particular reference to FIG. 1, there is illustrated a high-level block diagram of an exemplary integrated circuit in accordance with one embodiment. In this example, the integrated circuit is a processor 100, including a semiconductor substrate on which integrated circuit is fabricated in a manner known in the art. Processor 100 includes a plurality of cores 102 (e.g., 4, 8, 12, 16, 20, 32, etc.) for processing data and instructions in accordance with a selected instruction set architecture (x86, POWER, RISC5, ARM, etc.). Although not required, in this example, each core 102 includes an embedded static random access memory (SRAM) 104 providing high performance (i.e., low access latency) storage for data and/or instructions processed by that core 102.

In the depicted embodiment, each SRAM 104 includes a plurality of independently controllable SRAM macros 110. In some implementations, processor 100 is configured to initially place a first subset of the SRAM macros 110 into service and to reserve a second subset of SRAM macros 110 as spare(s) that can be substituted for a failing or failed SRAM macro 110. Those skilled in the art will appreciate that in some embodiments, one or more of SRAMs 104 and/or SRAM macros 110 may be implemented within processor 100, but not within one of cores 102. Further, in some embodiments, one or more SRAM macros 110 may form a shared spare pool from which processor 100 can automatically allocate storage to any one of multiple cores 102, for example, in place of a failing or failed SRAM macro 110.

Figure 2:
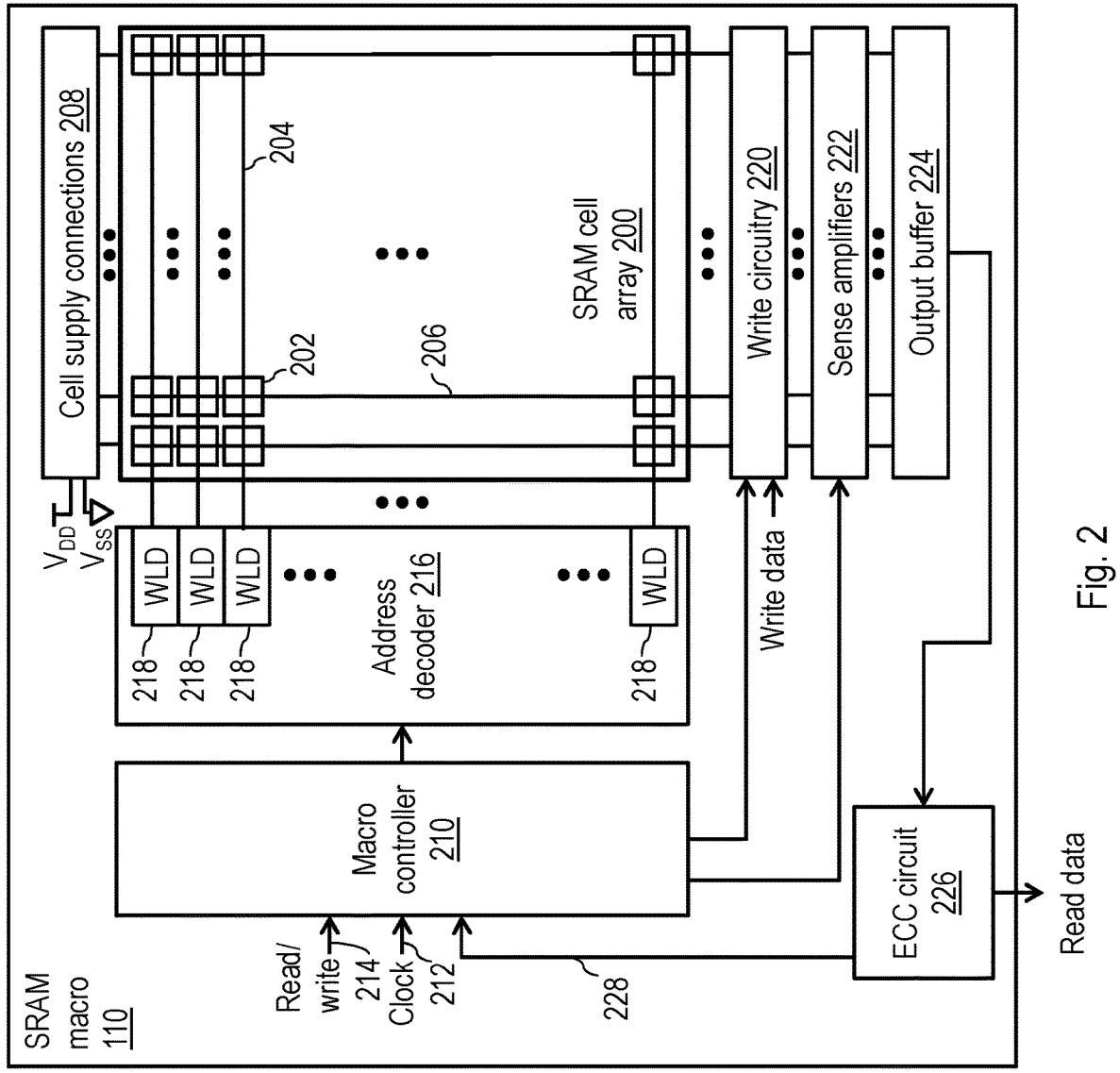
FIG. 2 is a more detailed block diagram of an exemplary embodiment of a static random access memory (SRAM) macro in the integrated circuit of FIG. 1.

With reference now to FIG. 2, there is illustrated a more detailed block diagram of an exemplary embodiment of a static random access memory (SRAM) macro 110 in the integrated circuit of FIG. 1. SRAM macro 110 includes a SRAM cell array 200 including multiplicity of individual memory cells 202. Memory cells 202 are physically arranged in a matrix including a plurality of rows (e.g., M rows), each accessed via a respective wordline 204, and a plurality of columns (e.g., N columns), each accessed via respective bitline(s) 206 (generally, a pair of bitlines, including a bitline true (BLT) and a bitline complement (BLC)). If implemented in a conventional manner (i.e., as a 6T cell), each memory cell 202 includes a pair of cross-coupled inverters and two NMOS pass transistors connecting the inverters to a bitline pair (BLT and BLC), where the NMOS pass transistors are controlled by the relevant wordline 204. Memory cells 202 within SRAM cell array 200 are powered via cell supply connections 208 to an upper supply voltage $V_{DD}$ and a lower supply voltage $V_{SS}$ (e.g., ground).

SRAM macro 110 includes a macro controller 210 having a first input that receives a reference clock signal 212 and a second input that that receives read/write access commands 214, each specifying a target address. In response to these inputs, macro controller 210 orchestrates read and write accesses to the relevant memory cells 202 within SRAM cell array 200. Macro controller 210 is coupled to an address decoder 216, to which macro controller 210 forwards the target address of each read or write command. Address decoder 216, which includes a wordline driver (WLD) 218 for each wordline 204, decodes the target address to identify a corresponding wordline 204. The wordline driver 218 for the identified wordline 204 then asserts its corresponding wordline 204 to access the coupled memory cells 202. For a write command, macro controller 210 also controls write circuitry 220 to apply write data received in conjunction with the write command to the relevant bit lines 206, thus updating the accessed memory cells 202. For a read command, assertion of the selected wordline 204 causes the bits stored in the memory cells 202 coupled to that wordline 204 to be read out onto bitlines 206, detected by sense amplifiers 222, and buffered in output buffer 224. The output data are passed to an error correcting code (ECC) circuit 226, which detects, and if possible, corrects, errors in the output data. The corrected output data are returned to a requestor as read data. ECC circuit 226 additionally reports, via signal line 228, any correctable errors (CEs) and uncorrectable errors (UEs) detected in the output data to macro controller 210. For CEs, ECC circuit 226 may optionally provide the corrected data to write circuitry 220 as write data in order to enable the corrected data to be written back into SRAM cell array 200.

In accordance with the disclosed inventions, SRAM macro 110 includes one or more assist circuits, where each such assist circuit is configured and coupled to selectively and temporarily boost a voltage of one or more conductive lines within SRAM cell array 200 either above upper supply voltage $V_{DD}$ (a positive boost) or below lower supply voltage $V_{SS}$ (a negative boost) during a read or write access. As noted above, such assist circuits are conventionally employed with SRAMs to retain a desired level of performance while reducing baseline power dissipation and heat. For example, in some embodiments, SRAM macro 110 may incorporate such an assist circuit within wordline drivers 218 to enable wordline drivers 218 to boost a voltage pulse applied to wordlines 204 above upper supply voltage $V_{DD}$ during read and/or write accesses to SRAM cell array 200. In some embodiments, SRAM macro 110 may alternatively or additionally include such an assist circuit within cell supply connections 208 in order to temporarily apply a positive boost to the voltage of the upper power rail of memory cells 202 and/or to temporarily apply a negative boost to the voltage on the lower power rail of memory cells 202. In some embodiments, SRAM macro 110 may alternatively or additionally include such assist circuits within write circuitry 220 to apply a boost (usually negative) to the precharge voltage applied to bitlines 206.

Figure 3:
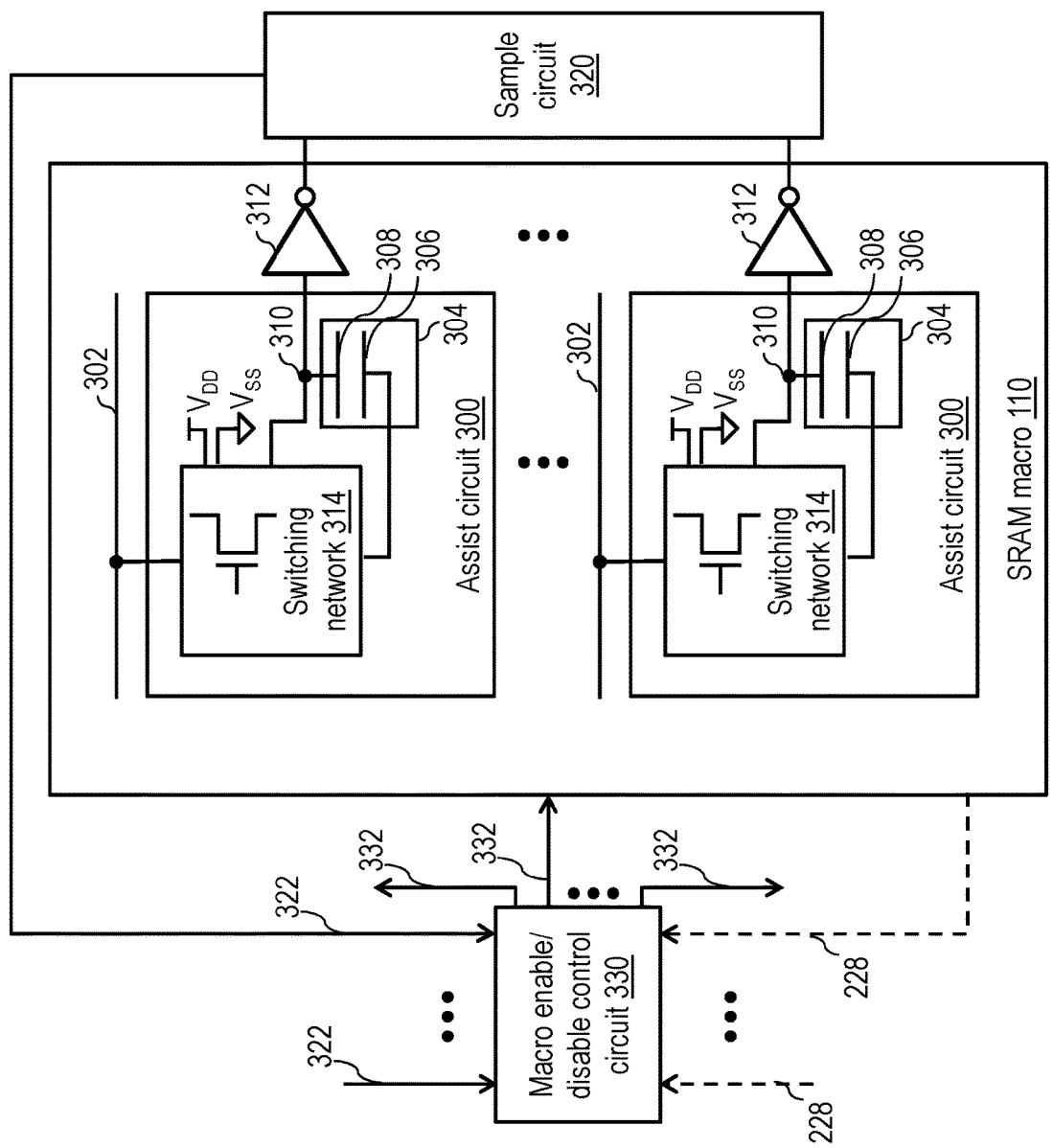
FIG. 3 illustrates an exemplary short circuit detection circuit in accordance with one embodiment.

With reference now to FIG. 3, there is illustrated a simplified view of SRAM macro 110 of FIG. 2, which illustrates an exemplary short circuit detection circuit in accordance with one embodiment. In this view, SRAM macro 110 includes a plurality of assist circuits 300 as described above. As noted above, assist circuits 300 can be of one or more types and can provide either a positive boost or a negative boost to the voltage on a conductive line 302 (e.g., a power rail of a memory cell 202, a wordline 204, a bitline 206, etc.) coupled to the assist circuit 300. Although the specific details of assist circuit 300 will vary based on application, in general, each assist circuit 300 includes a boost capacitor 304 and a switching network 314 that can be controlled, for example, by macro controller 210, to selectively and temporarily apply a boost voltage present on boost capacitor 304 to conductive line 302.

Each boost capacitor 304 includes a first plate 306 and a second plate 308. As explained above, it is known in the art to implement a boost capacitor with two sets of nominally parallel metal lines (or wires) deposited over SRAM macro 110, with the capacitance of the boost capacitor 304 being determined by the capacitive coupling between the first set of metal wires forming first plate 306 and the second set of metal wires forming second plate 308. In the depicted example, first plate 306 is an active plate, which switching network 314 connects to a selected reference supply voltage during an idle period between accesses to SRAM cell array 200. For example, if an assist circuit 300 is to provide a positive boost to second plate 308 of boost capacitor 304, macro controller 210 controls switching network 314 to connect first plate 306 to lower supply voltage $V_{SS}$, and if the assist circuit 300 is to provide a negative boost to second plate 308, macro controller 210 controls switching network 314 to connect first plate 306 to upper supply voltage $V_{DD}$. When a boost operation is active (e.g., during an access to SRAM cell array 200), switching network 314 switches the voltage on first plate 306 up or down to provide a coupling action to plate 308 and boost the voltage of second plate 308 either positively or negatively, respectively. During the idle period, switching network 314 applies to plate 308 the opposite voltage state from plate 306 (e.g., upper supply voltage $V_{DD}$ or lower supply voltage $V_{SS}$ for positive and negative boost operations, respectively). During the boost operation, switching network 314 allows the voltage of second plate 308 to float prior to switching the state of first plate 306 in order to allow the coupling effect of first plate 306 switching states to impact the voltage state of second plate 308.

In order to detect a short circuit, if any, in a boost capacitor 304, macro controller 210 controls switching network 314 to operate in a different manner than during boost operation. As described in greater detail below with reference to FIG. 4, macro controller 210 controls switching network 314 to actively connect first plate 306 to lower supply voltage $V_{SS}$ or to upper supply voltage $V_{DD}$, depending on whether the boost operation of the assist circuit 300 is a positive or negative boost operation, respectively. In addition, macro controller 210 controls switching network 314 to charge second plate 308 to the opposite voltage state from first plate 306. Macro controller 210 then controls switching network 314 to float the voltage of second plate 308, providing a short circuit observation window in which a voltage state change of second plate 308 is indicative of a short circuit (i.e., current flow between plates 306, 308).

SRAM macro 110 additionally includes a respective sense circuit coupled at node 310 to second plate 308 of each of assist circuits 300. In the depicted embodiment, each sense circuit is implemented as an inverter 312, which is utilized to sense a state of second plate 308 of the boost capacitor 304 during the short circuit observation window. The states of the second plates 308 of the boost capacitors 304 of SRAM macro 110 sensed by the sense circuits are periodically captured during the recurring short circuit observation window by a sample circuit 320 associated with SRAM macro 110, where the frequency and duration of the short circuit observation window can be controlled, for example, by macro controller 210. A state transition of the output of an inverter 312, for example, from a logical low state to a logical high state, can be indicative of a short circuit between plates 306, 308 of a boost capacitor 304, as discussed further below with reference to FIG. 4. Those skilled in the art will appreciate that in different embodiments different designs of sense circuits can be utilized to sense voltage state transitions with differing levels of sensitivity and thus support detection of short circuits having differing levels of impedance (e.g., 2 MΩ, 200 kΩ, 20 kΩ, etc.) and current. Further, in some embodiments, sense circuit can include additional circuitry configured to detect and mitigate power glitches that may otherwise be incorrectly detected as short circuits.

In at least some embodiments, an integrated circuit such as processor 100 may additionally include a macro enable/disable control circuit 330 coupled to each of one or more sample circuits 320 via respective signal line(s) 322. Macro enable/disable control circuit 330 can be configured to provide a disable signal to a SRAM macro 110 in which a short circuit is detected in order to disable that SRAM macro 110. Macro enable/disable control circuit 330 can additionally be configured to provide an enable signal to a spare SRAM macro 110 to bring it up as a substitute for the disabled SRAM macro 110. As further illustrated in FIG. 3, macro enable/disable control circuit 330 may optionally be additionally coupled to receive error detection reports from ECC circuit 226 via signal lines 228. In some embodiments, macro enable/enable control circuit 330 can alternatively or additionally base a determination to disable an SRAM macro 110 on reports of CEs and UEs from that SRAM macro 110. Exemplary operation of macro enable/disable control circuit 330 is described in further detail below with reference to FIG. 5.

Figure 4:
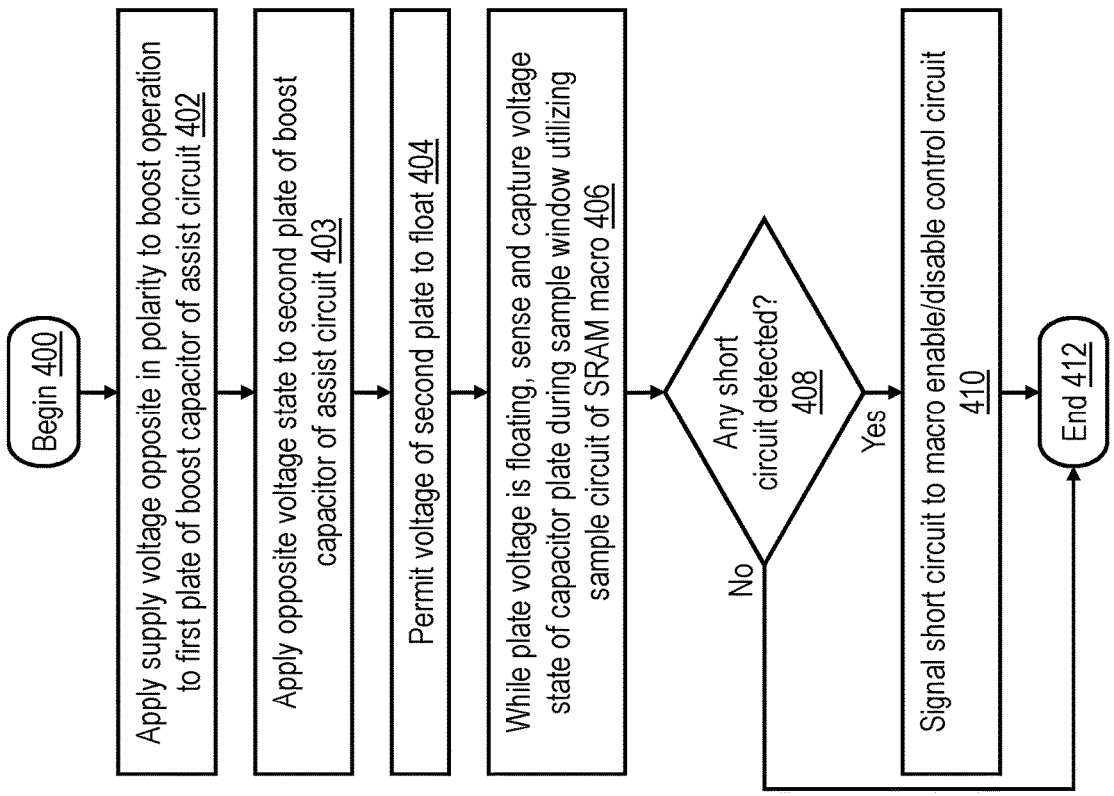
FIG. 4 is a high-level logical flowchart of an exemplary method of detecting a short circuit in a boost capacitor of a read/write assist circuit of a SRAM in accordance with one embodiment.

Referring now to FIG. 4, there is depicted a high-level logical flowchart of an exemplary method of detecting a short circuit in a boost capacitor of a read/write assist circuit of a SRAM in accordance with one embodiment. For ease of understanding, the method of FIG. 4 is described with reference to the exemplary SRAM macro 110 depicted in FIGS. 2-3.

The process of FIG. 4 begins at block 400 and then proceeds to block 402, which illustrates macro controller 210 controlling switching network 314 to apply to first plate 306 of the boost capacitor 304 of an assist circuit 300 a supply voltage opposite in polarity to the boost operation of the assist circuit 300. For example, macro controller 210 controls switching network 314 to apply to first plate 306 the upper supply voltage $V_{DD}$ if the assist circuit 300 provides a negative boost and to apply lower supply voltage $V_{SS}$ if the assist circuit 300 provides a positive boost. In addition, at block 403, macro controller 210 controls switching network 314 to charge second plate 308 to the opposite voltage state from first plate 306. At block 404, macro controller 210 then permits the voltage of second plate 308 to float by controlling switching network 314 to decouple second plate 308 from an external voltage reference, such as upper supply voltage $V_{DD}$ or lower supply voltage $V_{SS}$.

While the voltage of second plate 308 is allowed to float, the associated sense circuit (e.g., inverter 312) senses a voltage state change, if any, on the second plate 308 during the short circuit observation window, and sample circuit 320 captures any sensed voltage state change on second plate 308 (block 406). Sample circuit 320 determines at block 408 whether or not any short circuit is detected during the current short circuit observation window, for example, based on whether a logic low to logic high transition was detected during the short circuit observation window on the output of any of the inverters 312 to which it is coupled. If sample circuit 320 determines at block 408 that no short circuit is detected during the current short circuit observation window, the process of FIG. 4 ends at block 412 until occurrence of a next short circuit observation window. If, however, sample circuit 320 detects a short circuit during the current short circuit observation window at block 408, sample circuit 320 signals detection of the short circuit to macro enable/disable control circuit 330 via signal line 322. Thereafter, the process of FIG. 4 ends at block 412.

Figure 5:
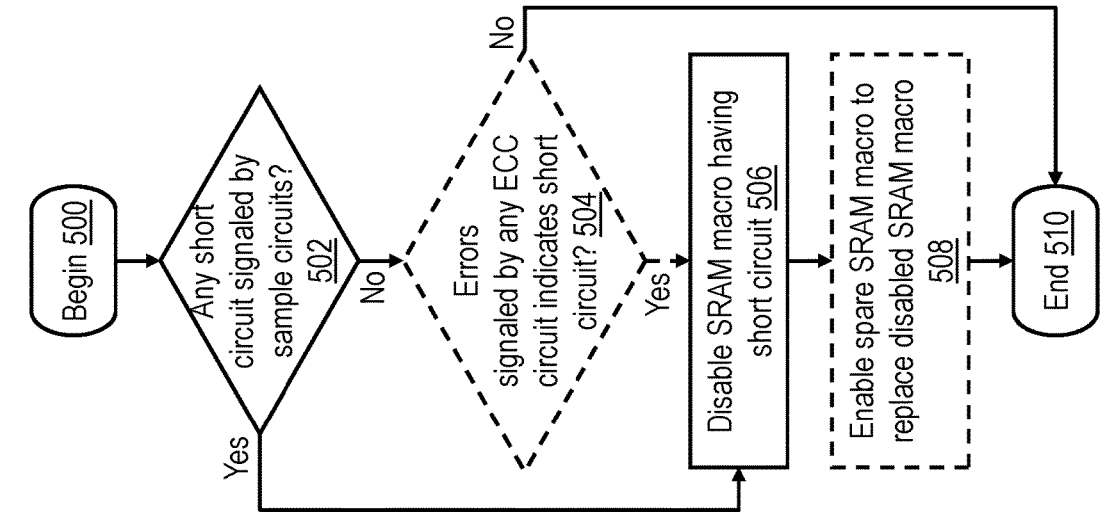
FIG. 5 is a high-level logical flowchart of an exemplary method of mitigating a short circuit in a boost capacitor of a read/write assist circuit of a SRAM in accordance with one embodiment.

With reference now to FIG. 5, there is illustrated a high-level logical flowchart of an exemplary method of mitigating a short circuit in a boost capacitor of a read/write assist circuit of a SRAM in accordance with one embodiment. The process of FIG. 5 can be periodically performed, for example, by macro enable/disable control circuit 330 of FIG. 3.

The process of FIG. 5 begins at block 500 and then proceeds to block 502, which illustrates macro enable/disable control circuit 330 determining whether or not a short circuit has been signaled by any of the coupled sample circuit 320, as discussed with respect to block 410 of FIG. 4. In response to an affirmative determination at block 502, the process proceeds to block 506, which is described below. In some embodiments in which optional block 504 is omitted, in response to a negative determination at block 502, the process simply ends at block 510 until macro enable/disable control circuit 330 again performs the illustrated process. In other embodiments in which optional block 504 is included and macro enable/disable control circuit 330 is coupled to receive ECC error indications via signal lines 228, macro enable/disable control circuit 330 optionally additionally determines at block 504 whether or not the number, type, and/or frequency of the errors signaled by one of ECC circuits 226 is indicative of a short circuit. For example, macro enable/disable control circuit 330 may detect the presence of a short circuit in a particular SRAM macro 110 based on a large increase in the number of UEs reported via its corresponding signal line 228. In response to a negative determination at optional block 504, the process of FIG. 5 ends at block 510. If, however, macro enable/disable control circuit 330 determines at block 504 that the errors signaled by one of ECC circuits 226 are indicative of a short circuit, the process from block 504 to block 506.

Block 506 illustrates macro enable/disable control circuit 330 disabling, via the relevant signal line 332 the SRAM macro 110 having the short circuit in its boost capacitor 304. To prevent the detected short circuit from causing further damage to the integrated circuit 100, macro controller 210 preferably actively floats second plate 308 of the boost capacitor 304 in which a short circuit is detected in order to eliminate any short circuit current, which could otherwise flow between capacitor plates 306, 308 tied to opposing supply voltages.

As indicated by optional block 508, macro enable/disable control circuit 330 may additionally enable, via the relevant signal line 332, a spare SRAM macro 110 to replace the disabled SRAM macro 110. Thereafter, the process of FIG. 5 ends at block 510. It should further be appreciated that in some alternative embodiments, macro enable/disable control circuit 330 may disable an SRAM macro 110 based on affirmative determinations at both of blocks 502, 504 rather than based on an affirmative determination of either of blocks 502, 504 as shown in FIG. 5.

Figure 6:
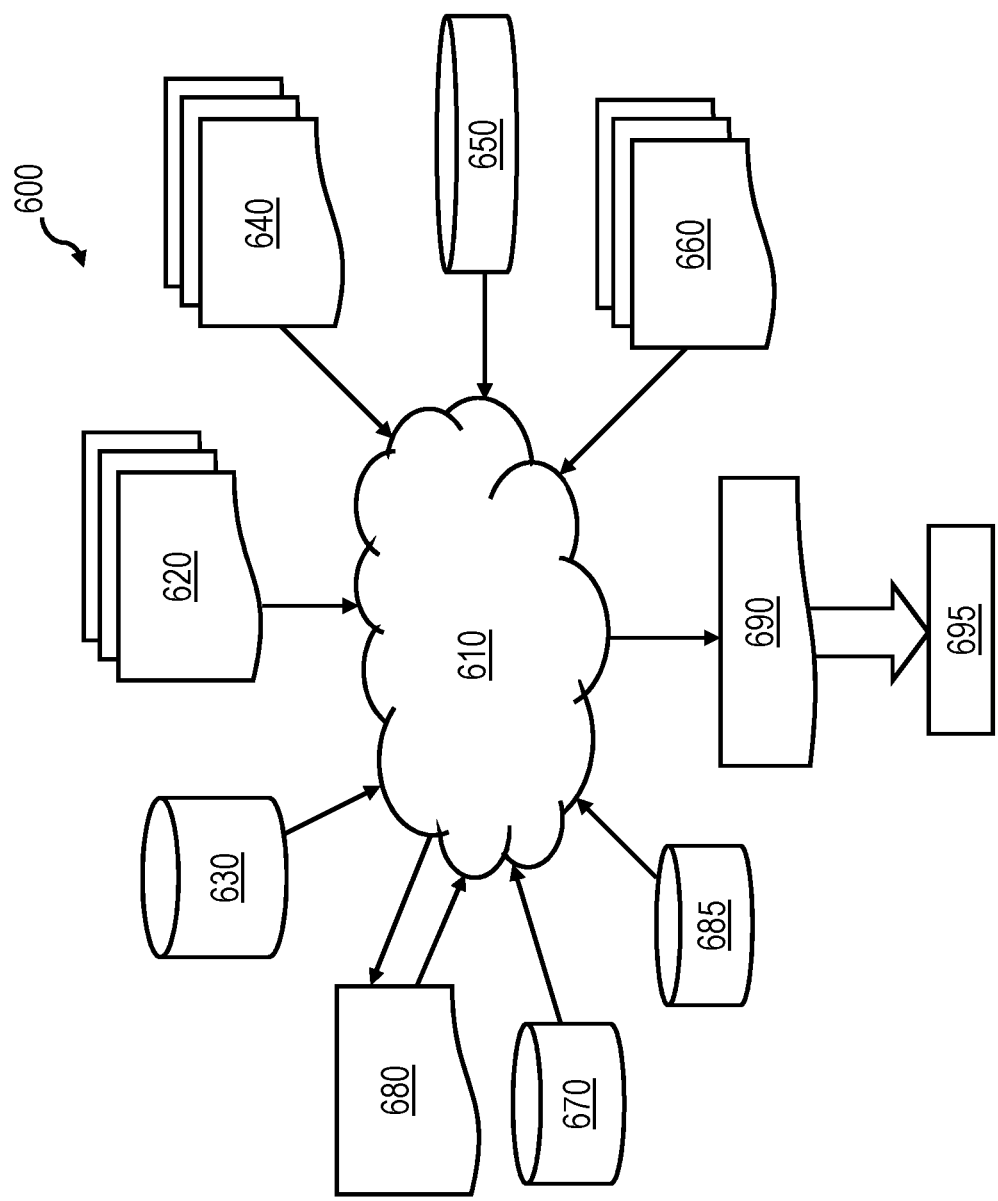
FIG. 6 is a data flow diagram illustrating a design process.

Referring now to FIG. 6, there is depicted a block diagram of an exemplary design flow 600 used for example, in semiconductor IC logic design, simulation, test, layout, and manufacture. Design flow 600 includes processes, machines and/or mechanisms for processing design structures or devices to generate logically or otherwise functionally equivalent representations of the design structures and/or devices described above. The design structures processed and/or generated by design flow 600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 600 may vary depending on the type of representation being designed. For example, a design flow 600 for building an application specific IC (ASIC) may differ from a design flow 600 for designing a standard component or from a design flow 600 for instantiating the design into a programmable array, for example a programmable gate array (PGA) or a field programmable gate array (FPGA) offered by Altera® Inc. or Xilinx® Inc.

FIG. 6 illustrates multiple such design structures including an input design structure 620 that is preferably processed by a design process 610. Design structure 620 may be a logical simulation design structure generated and processed by design process 610 to produce a logically equivalent functional representation of a hardware device. Design structure 620 may also or alternatively comprise data and/or program instructions that when processed by design process 610, generate a functional representation of the physical structure of a hardware device. Whether representing functional and/or structural design features, design structure 620 may be generated using electronic computer-aided design (ECAD) such as implemented by a core developer/designer. When encoded on a machine-readable data transmission, gate array, or storage medium, design structure 620 may be accessed and processed by one or more hardware and/or software modules within design process 610 to simulate or otherwise functionally represent an electronic component, circuit, electronic or logic module, apparatus, device, or system such as those shown herein. As such, design structure 620 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 610 preferably employs and incorporates hardware and/or software modules for synthesizing, translating, or otherwise processing a design/simulation functional equivalent of the components, circuits, devices, or logic structures shown herein to generate a netlist 680 which may contain design structures such as design structure 620. Netlist 680 may comprise, for example, compiled or otherwise processed data structures representing a list of wires, discrete components, logic gates, control circuits, I/O devices, models, etc. that describes the connections to other elements and circuits in an integrated circuit design. Netlist 680 may be synthesized using an iterative process in which netlist 680 is resynthesized one or more times depending on design specifications and parameters for the device. As with other design structure types described herein, netlist 680 may be recorded on a machine-readable storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, or buffer space.

Design process 610 may include hardware and software modules for processing a variety of input data structure types including netlist 680. Such data structure types may reside, for example, within library elements 630 and include a set of commonly used elements, circuits, and devices, including models, layouts, and symbolic representations, for a given manufacturing technology (e.g., different technology nodes, 10 nm, 20 nm, 30 nm, etc.). The data structure types may further include design specifications 640, characterization data 650, verification data 660, design rules 670, and test data files 685 which may include input test patterns, output test results, and other testing information. Design process 610 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 610 without deviating from the scope and spirit of the invention. Design process 610 may also include modules for performing standard circuit design processes such as timing analysis, verification, design rule checking, place and route operations, etc.

Design process 610 employs and incorporates logic and physical design tools such as HDL compilers and simulation model build tools to process design structure 620 together with some or all of the depicted supporting data structures along with any additional mechanical design or data (if applicable), to generate a second design structure 690. Design structure 690 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 620, design structure 690 preferably comprises one or more files, data structures, or other computer-encoded data or instructions that reside on transmission or data storage media and that when processed by an ECAD system generate a logically or otherwise functionally equivalent form of one or more of the embodiments of the invention shown herein. In one embodiment, design structure 690 may comprise a compiled, executable HDL simulation model that functionally simulates one or more of the devices shown herein.

Design structure 690 may also employ a data format used for the exchange of layout data of integrated circuits and/or symbolic data format (e.g., information stored in a GDSII (GDS2), GL1, OASIS, map files, or any other suitable format for storing such design data structures). Design structure 690 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown herein. Design structure 690 may then proceed to a stage 695 where, for example, design structure 690: proceeds to tape-out, is released to manufacturing, is released to a mask house, is sent to another design house, is sent back to the customer, etc.

As has been described, in at least one embodiment, an integrated circuit includes a semiconductor substrate and integrated circuitry on the semiconductor substrate. The integrated circuitry includes a static random access memory (SRAM) array including a conductive line and an assist circuit having a boost capacitor coupled to boost a voltage on the conductive line. The boost capacitor includes first and second plates. The integrated circuit further includes a sense circuit having an input coupled to one of the first and second plates of the boost capacitor and an output and a sample circuit coupled to the output of the sense circuit. The sample circuit is configured to detect a short circuit in the boost capacitor based on a state change at the output of the sense circuit.

While various embodiments have been particularly shown and described, it will be understood by those skilled in the art that various changes in form and detail may be made therein without departing from the spirit and scope of the appended claims and these alternate implementations all fall within the scope of the appended claims. For example, although aspects have been described with respect to a computer system executing program code that directs the functions of the present invention, it should be understood that present invention may alternatively be implemented as a program product including a computer-readable storage device storing program code that can be processed by a processor of a data processing system to cause the data processing system to perform the described functions. The computer-readable storage device can include volatile or non-volatile memory, an optical or magnetic disk, or the like, but excludes non-statutory subject matter, such as propagating signals per se, transmission media per se, and forms of energy per se.

As an example, the program product may include data and/or instructions that when executed or otherwise processed on a data processing system generate a logically, structurally, or otherwise functionally equivalent representation (including a simulation model) of hardware components, circuits, devices, or systems disclosed herein. Such data and/or instructions may include hardware-description language (HDL) design entities or other data structures conforming to and/or compatible with lower-level HDL design languages such as Verilog and VHDL, and/or higher level design languages such as C or C++. Furthermore, the data and/or instructions may also employ a data format used for the exchange of layout data of integrated circuits and/or symbolic data format (e.g. information stored in a GDSII (GDS2), GL1, OASIS, map files, or any other suitable format for storing such design data structures).

The figures described herein and the written description of specific structures and functions are not presented to limit the scope of what Applicants have invented or the scope of the appended claims. Rather, the figures and written description are provided to teach any person skilled in the art to make and use the inventions for which patent protection is sought. Those skilled in the art will appreciate that not all features of a commercial embodiment of the inventions are described or shown for the sake of clarity and understanding.

Persons of skill in this art will also appreciate that the development of an actual commercial embodiment incorporating aspects of the present inventions will require numerous implementation-specific decisions to achieve the developer's ultimate goal for the commercial embodiment. Such implementation-specific decisions may include, and likely are not limited to, compliance with system-related, business-related, government-related and other constraints, which may vary by specific implementation, location and from time to time. While a developer's efforts might be complex and time-consuming in an absolute sense, such efforts would be, nevertheless, a routine undertaking for those of skill in this art having benefit of this disclosure. It must be understood that the inventions disclosed and taught herein are susceptible to numerous and various modifications and alternative forms. Lastly, the use of a singular term, such as, but not limited to, "a" is not intended as limiting of the number of items.

What is claimed is:

1. An integrated circuit, comprising:
a semiconductor substrate;
integrated circuitry on the semiconductor substrate, wherein the integrated circuitry includes:
   a static random access memory (SRAM) cell array including a conductive line;
   an assist circuit including a boost capacitor coupled to boost a voltage on the conductive line, wherein the boost capacitor includes first and second plates;
   a sense circuit having an input coupled to one of the first and second plates of the boost capacitor and an output; and
   a sample circuit coupled to the output of the sense circuit, wherein the sample circuit is configured to detect a short circuit in the boost capacitor based on a state change at the output of the sense circuit.

2. The integrated circuit of claim 1, further comprising a switching network coupling the boost capacitor and the conductive line.

3. The integrated circuit of claim 1, wherein:
the integrated circuit includes at least a first SRAM macro including at least the SRAM cell array and the assist circuit;
the integrated circuit further comprises a control circuit coupled to the sample circuit, wherein the control circuit is configured to disable the first SRAM macro based on the sample circuit detecting a short circuit in the boost capacitor.

4. The integrated circuit of claim 3, wherein:
the integrated circuit includes a spare second SRAM macro; and
the control circuit is further configured to enable the spare second SRAM macro in place of the first SRAM macro based on the sample circuit detecting a short circuit in the boost capacitor.

5. The integrated circuit of claim 3, wherein:
the integrated circuit includes an error-correcting code circuit coupled to receive read data output from the SRAM cell array and further coupled to provide error indications to the control circuit; and
the control circuit is configured to disable the first SRAM macro based on the sample circuit detecting a short circuit in the boost capacitor and the error indications.

6. The integrated circuit of claim 1, wherein each of first and second plates of the boost capacitor comprises a plurality of metal lines overlaying the SRAM cell array.

7. The integrated circuit of claim 1, wherein the sense circuit comprises an inverter.

8. A method of detecting a short circuit in a boost capacitor of an integrated circuit, the method comprising:
in an assist circuit of a static random access memory (SRAM) array including a conductive line, applying a first reference voltage to a first plate of a boost capacitor and second reference voltage to a second plate of the boost capacitor;
permitting a voltage of the second plate of the boost capacitor to float;
while the voltage of the second plate of the boost capacitor is floating, sensing the voltage of the plate utilizing an sense circuit, the sense circuit having an output; and
sampling, by a sample circuit, the output of the sense circuit to detect a short circuit in the boost capacitor based on a state change at the output of the sense circuit.

9. The method of claim 8, wherein applying the first and second reference voltages includes applying the first and second reference voltages via a switching network.

10. The method of claim 8, wherein:
the integrated circuit includes at least a first SRAM macro including at least the SRAM cell array and the assist circuit;
the method further comprises disabling, by a control circuit, the first SRAM macro based on detecting the short circuit in the boost capacitor.

11. The method of claim 10, wherein:
the integrated circuit includes a spare second SRAM macro; and
the method further comprises enabling the spare second SRAM macro in place of the first SRAM macro based on detecting the short circuit in the boost capacitor.

12. The method of claim 10, wherein:
detecting, by an error correcting code circuit, errors in read data output from the SRAM cell array; and
the disabling includes disabling the first SRAM macro based on the sample circuit detecting the short circuit in the boost capacitor and detection of errors by the error correcting code circuit.

13. The method of claim 8, wherein the plate of the boost capacitor comprises a plurality of metal lines overlaying the SRAM cell array.

14. The method of claim 8, wherein the sensing comprises sensing with an inverter.

15. A design structure tangibly embodied in a machine-readable storage device for designing, manufacturing, or testing an integrated circuit, the design structure comprising:
an embedded circuit, including:
a static random access memory (SRAM) array including a conductive line;
an assist circuit including a boost capacitor coupled to boost a voltage on the conductive line, wherein the boost capacitor includes first and second plates;
a sense circuit having an input coupled to one of the first and second plates of the boost capacitor and an output; and
a sample circuit coupled to the output of the sense circuit, wherein the sample circuit is configured to detect a short circuit in the boost capacitor based on a state change at the output of the sense circuit.

16. The design structure of claim 15, further comprising a switching network coupling the boost capacitor and the conductive line.

17. The design structure of claim 15, wherein:
the embedded circuit includes at least a first SRAM macro including at least the SRAM cell array and the assist circuit;
the embedded circuit further comprises a control circuit coupled to the sample circuit, wherein the control circuit is configured to disable the first SRAM macro based on the sample circuit detecting a short circuit in the boost capacitor.

18. The design structure of claim 17, wherein:
the embedded circuit includes a spare second SRAM macro; and
the control circuit is further configured to enable the spare second SRAM macro in place of the first SRAM macro based on the sample circuit detecting a short circuit in the boost capacitor.

19. The design structure of claim 17, wherein:
the embedded circuit includes an error correcting code circuit coupled to receive read data output from the SRAM cell array and further coupled to provide error indications to the control circuit; and
the control circuit is configured to disable the first SRAM macro based on the sample circuit detecting a short circuit in the boost capacitor and the error indications.

20. The design structure of claim 15, wherein each of first and second plates of the boost capacitor comprises a plurality of metal lines overlaying the SRAM cell array.

* * * * *